United States Patent
Paulus

[11] Patent Number: 6,091,073
[45] Date of Patent: *Jul. 18, 2000

[54] OPTOELECTRIC COUPLER

[75] Inventor: Eric James Paulus, Scottsdale, Ariz.

[73] Assignee: ITT Corporation, White Plains, N.Y.

[ * ] Notice: Under 35 U.S.C. 154(b), the term of this patent shall be extended for 906 days.

[21] Appl. No.: 08/541,254

[22] Filed: Oct. 12, 1995

Related U.S. Application Data

[63] Continuation of application No. 08/313,626, Sep. 27, 1994, abandoned.

[51] Int. Cl.$^7$ .................................................. G02B 27/00
[52] U.S. Cl. ............................ 250/551; 250/239; 257/81
[58] Field of Search ................................... 250/551, 239; 439/76, 620, 655; 385/88; 257/81

[56] References Cited

U.S. PATENT DOCUMENTS

| | | |
|---|---|---|
| 3,414,733 | 12/1968 | Wunderman . |
| 3,562,527 | 2/1971 | Chaimowicz . |
| 4,354,115 | 10/1982 | Warabisako et al. ................. 250/551 |
| 4,401,360 | 8/1983 | Streckman et al. ................. 350/96.15 |
| 4,634,877 | 1/1987 | Wills ..................................... 250/551 |
| 4,776,659 | 10/1988 | Mruk . |
| 4,829,192 | 5/1989 | Kokubu ................................. 250/551 |
| 5,148,243 | 9/1992 | Merrick et al. ........................... 357/17 |
| 5,285,076 | 2/1994 | Kusuda et al. ......................... 250/551 |
| 5,296,715 | 3/1994 | Kronberg ................................ 250/551 |
| 5,299,727 | 4/1994 | Kofler . |

FOREIGN PATENT DOCUMENTS 36 17 057   11/1987   Germany .

*Primary Examiner*—Stephone B. Allen
*Attorney, Agent, or Firm*—Thomas L. Peterson

[57] ABSTRACT

Apparatus is described for transmitting signals between electric terminals through photo diodes to electrically isolate circuits connected to the terminals, which is compact and rugged. The apparatus includes a metal shell, (24, FIG. 2) a pair of circuit boards (40, 42) mounted in the shell and axially spaced apart, pairs of terminals (12, 14) with one terminal of each pair mounted on a different one of the circuit boards, and pairs of photo diodes or other optoelectric transducers (16, 18). Each transducer of a pair is mounted to a different circuit board and connected to a corresponding terminal, and the two transducers are aligned and extend toward each other. A separator element (90) of opaque material occupies most of the space between the circuit boards and has holes (92) that receive the two transducers of each pair. The separator element prevents the leakage of light between different pairs of transducers, and also helps to assure alignment of each pair of transducers.

9 Claims, 2 Drawing Sheets

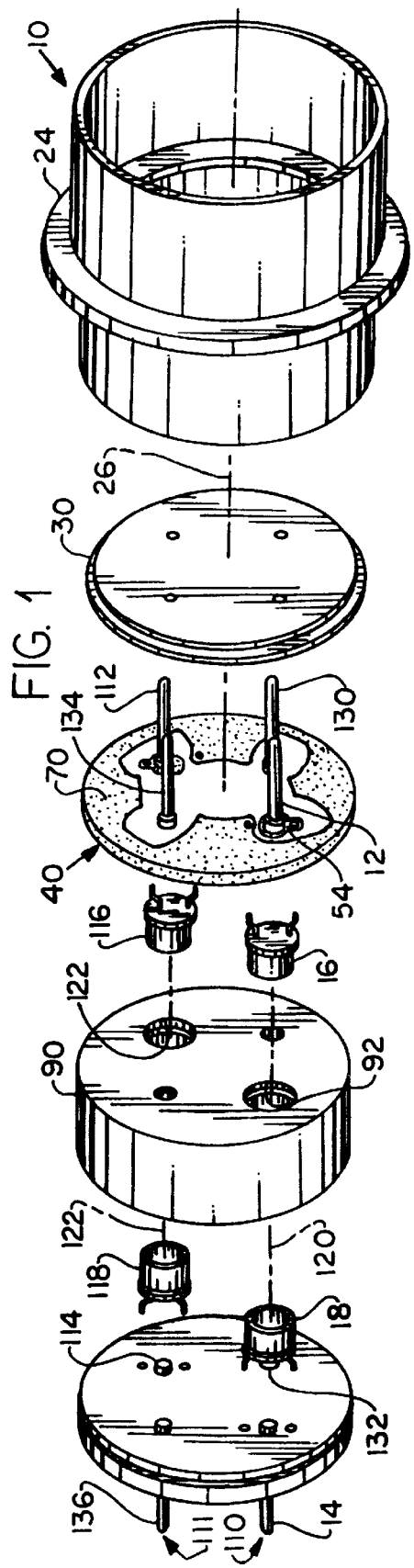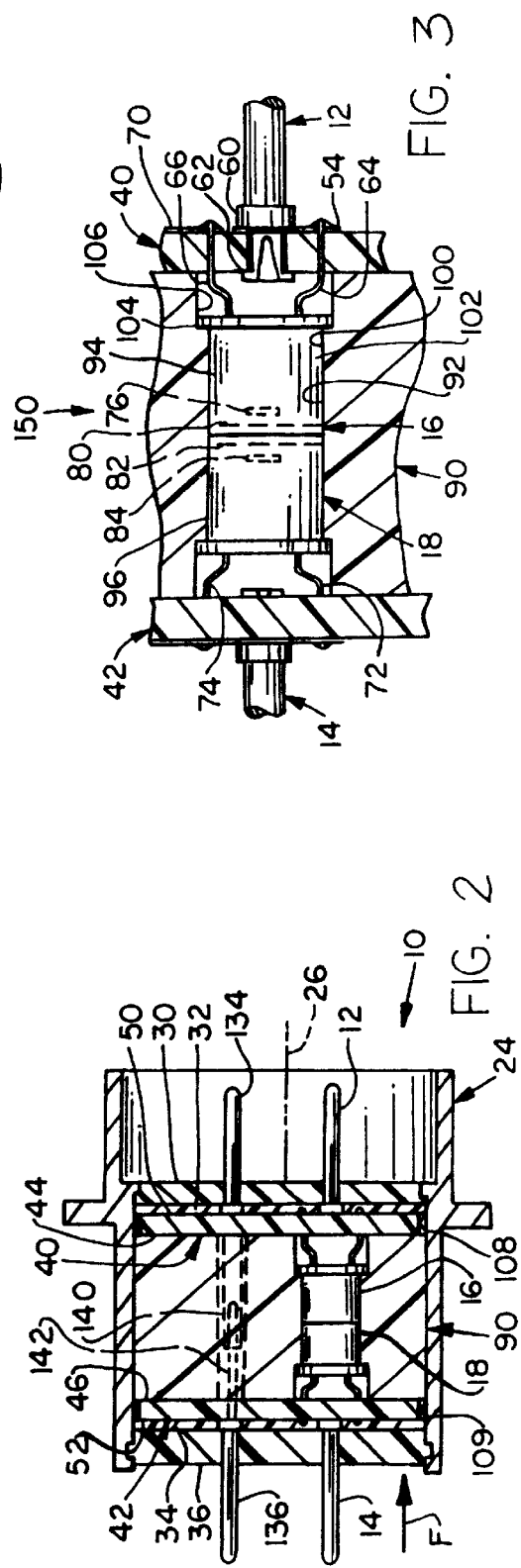

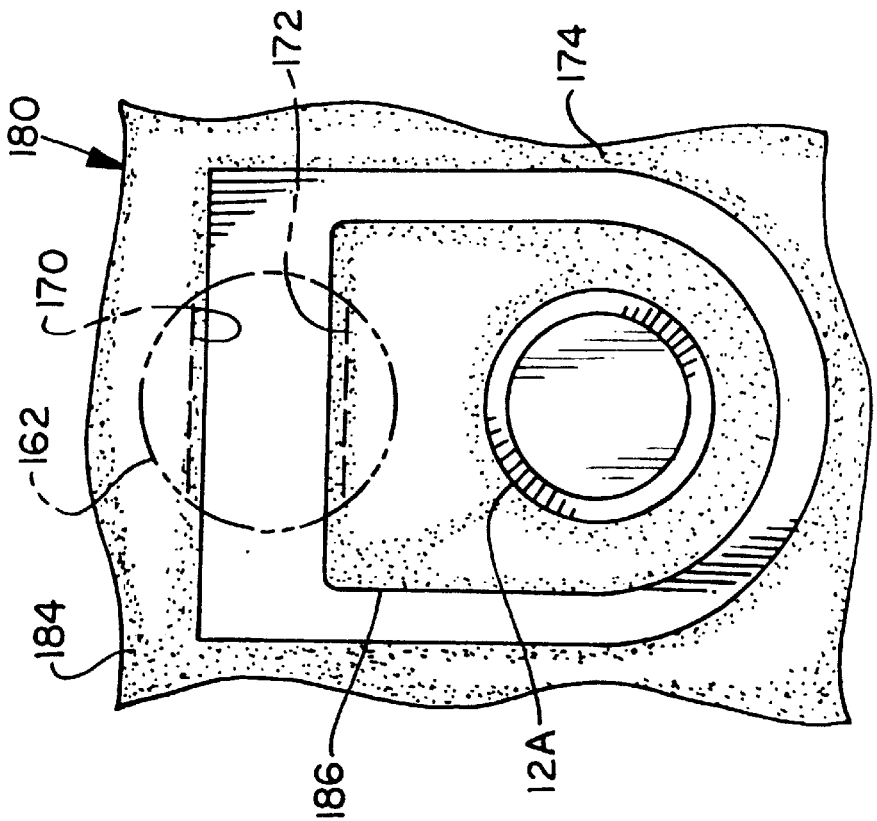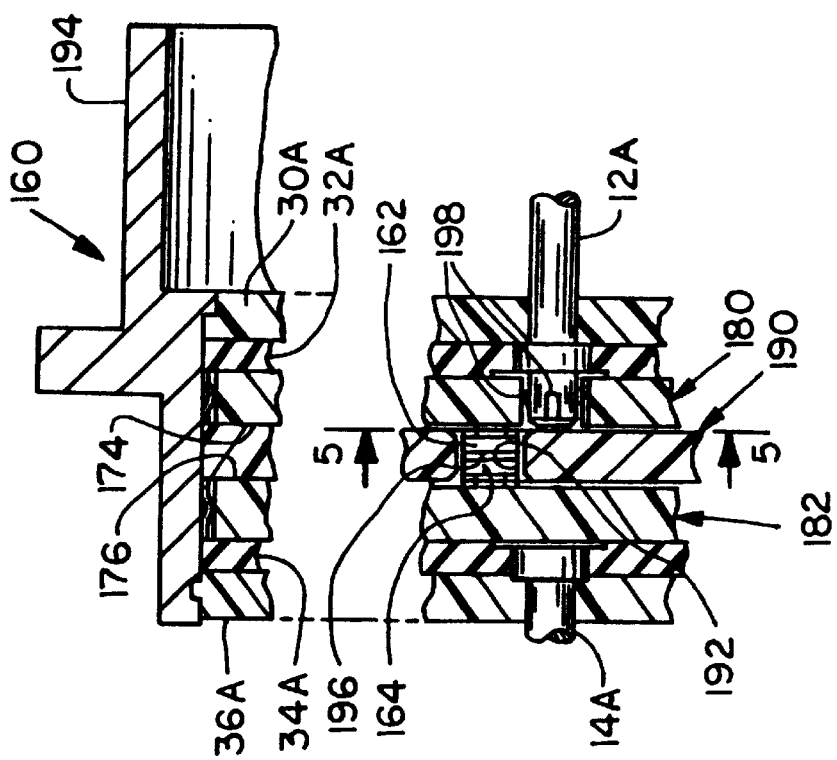

OPTOELECTRIC COUPLER

This is a continuation of application Ser. No. 08/313,626 filed on Sep. 27, 1994, now abandoned.

BACKGROUND OF THE INVENTION

There are instances where it is desired to transmit electrical signals between two circuits, while electrically isolating each circuit from the other. This can be accomplished by using photo diodes or other optoelectric transducers to transmit the signal by modulated light. One prior art arrangement involves the use of a circuit board with a pair of electrical connectors for receiving signals and with a pair of optoelectric transducers mounted on the board to face each other, and with each transducer electrically coupled to a different one of the connectors. Such an arrangement is relatively fragile and occupies a considerable area, especially where several separate optical couplings are required and where the apparatus must be shielded from EMI (electromagnetic interference). An optoelectric coupling apparatus which was compact, rugged, and economical, would be useful.

SUMMARY OF THE INVENTION

In accordance with one embodiment of the present invention, an optoelectric coupling apparatus is provided, which is compact, rugged, and economical. The apparatus includes a pair of circuit boards lying in parallel planes within a shell. One or more optoelectric arrangements are provided that extend along different parallel optoelectric paths. Each arrangement includes an electrical terminal mounted on a different one of the circuit boards and having an elongated terminal part extending from an outer side of the board which faces away from the other board. The arrangement also includes a pair of optoelectric transducers that are each electrically connected to a corresponding one of the terminals, and that face one another to transmit and receive light between them representing signals carried by the terminals. The optoelectric coupling apparatus utilizes construction and mounting technology that has long been developed for electrical connectors to provide compactness, ruggedness, and low cost.

The novel features of the invention are set forth with particularity in the appended claims. The invention will be best understood from the following description when read in conjunction with the accompanying drawings.

BRIEF DESCRIPTION OF THE DRAWINGS

FIG. 1 is a partial exploded isometric view of an optoelectric coupling apparatus constructed in accordance with the present invention.

FIG. 2 is a sectional view of the apparatus of FIG. 1.

FIG. 3 is an enlarged view of a portion of the apparatus of FIG. 1.

FIG. 4 is a partial sectional view of an optoelectrical coupling apparatus constructed in accordance with another embodiment of the invention.

FIG. 5 is a view taken 5—5 of FIG. 4.

DESCRIPTION OF THE PREFERRED EMBODIMENTS

FIG. 2 illustrates an optoelectric coupling apparatus 10, showing a pair of electrical terminals 12, 14 through which electrical signal currents flow. Signals are applied to one of the terminals such as 12 and are transmitted to the other through a pair of optoelectric transducers 16, 18. The first transducer 16 receives electric currents representing the signal to be transferred, from the terminal 12, and the transducer 16 generates a light beam which is modulated to represent the signal. The second transducer 18 detects the light beam and produces an electrical current representing the signal, and carries the electrical current to the second terminal 14. Each of the terminals 12, 14 is part of a separate electrical circuit which may include transducers, resistors, and other electrical components. The terminal 12 may be a pin or socket contact, and the terminal 14 may be a similar contact, a wire wrap terminal, or of other construction. The transmission of signals between the circuits wherein a light beam is part of the connection, is well known to be useful in electrically isolating the two circuits from each other.

In accordance with the present invention, applicant constructs the optoelectric coupling apparatus 10 to largely mimic the construction of electrical connectors of the type wherein only currents flow between terminals at opposite ends, rather than along any light beams. To this end, the apparatus includes a conductive metal shell 24 that has an axis 26, and a plurality of components (including separator 90) that extend across substantially the entire width of the shell. These components include a front insulator 30 near the front of the shell and a front seal 32 behind the front insulator, and a rear rubber seal 34 near the rear of the shell and a rear insulator 36 that may be in the form of epoxy, with the terminals projecting through the insulators and seals.

Applicant provides first and second circuit boards 40, 42 within the shell and between the front and rear seals thereof. Each board extends across a majority of the width of the shell inside. Each circuit board has an inner face 44, 46 facing the other board and an outer face 50, 52 facing away from the other board. As shown in FIG. 3, the front or first terminal 12 is mounted to the first circuit board 40, and is electrically connected to a trace 54 on the board. The particular terminal shown has a flange 60 that abuts the outer face of the board, and has a pair of resilient arm forming shoulders 62 that abut the inner face of the board, although a variety of mounting techniques can be used. The first transducer 16 has a pair of flexible leads 64, 66, with one lead 64 passing through a plated hole in the circuit board and soldered to the trace 54 to thereby electrically connect to the terminal 12. The other lead 66 of the transducer also passes through a plated hole of the board and is soldered to a grounded trace 70 on the board, which is not directly connected to the terminal 12. The particular transducer 16 is a photodiode that has only two terminals. However, a variety of devices are available which can transmit and/or detect light, and which may have more than two leads or other terminal parts. Any such transducer may produce light directly solely by currents passing through the terminal 12 (to ground), or may use the currents on terminal 12 only to modulate light produced from a separate current source (which may be a direct current source). Similarly, any such transducer can generate a current by the energy of detected light, or may use the detected light to modulate a current.

The second terminal 14 of the apparatus 10 is similarly mounted on the second circuit board 42. The second transducer 18 has leads 72, 74 that are similarly connected, one to the terminal 14, and the other to a grounded trace on the second circuit board. In the particular example shown in FIG. 3, the first transducer 16 has a light emitting part 76 whose light passes through windows 80, 82 of the two transducers to reach a light detecting part 84 of the second transducer to generate a current thereat.

A separator 90 is provided within the shell, which lies between the circuit boards 40, 42, which has a thickness that is substantially equal to the distance between the board innerfaces, and which substantially abuts their inner faces. In FIG. 3, it can be seen that the separator 90 has a through hole 92 into which the transducers 16, 18 project. The particular transducers have rigid bodies 94, 96 and flexible leads extending therefrom, and the bodies are closely positioned and oriented by the walls of the through hole 92 in the separator element. In particular, the hole has a middle hole portion 100 which very closely receives parts of the bodies 94, 96, with a clearance between the rigid body portion 102 and the walls of the hole part 100 being less than five thousandths inch. The body 94 has a flange 104 that limits its depth of insertion into the separator, with the separator hole having enlarged ends 106 to accommodate the flange 104 and the flexible leads 64, 66. The second transducer 18 is similarly mounted in the separator so the separator closely positions and orients it. The separator assures that the two transducers are aligned so a high proportion of light emitted by one is detected by the other. It is possible to mount a lens in the separator between the transducers, to enhance the transmission of light between them.

The separator 90 is preferably formed of opaque dielectric material. Where the optoelectric coupling apparatus contains a plurality of optical couplings that each transmits a separate signal, the presence of the separator prevents a leakage of light from one transducer of a pair to another, which could cause crosstalk.

As shown in FIG. 1, each of the circuit boards such as board 40 may be constructed so the grounded trace 70 extends over a large portion of the board surface and extends to the periphery of the board. A pair of spring contacts shown at 108, 109 (FIG. 2) lie around each of the boards and connect their grounded traces to the conductive shell 24. The grounded traces serve as ground planes that minimize cross talk and other EMI (electromagnetic interference) between terminals at the same end of the connector and between terminals such as 12, 14 at the opposite ends of the connector. It is also possible to provide a ground plane within the separator element, where necessary. It can be seen from FIG. 1, that the apparatus 10 includes two optoelectric coupling arrangements 110,111 extending along two coupling paths 120, 122. The first coupling arrangement 110 includes the pair of optoelectric transducers 16, 18 and the pair of terminals 12, 14. The second coupling arrangement 111 includes a pair of terminals 112, 114, and a pair of transducers 116, 118. The separator element 90 includes corresponding transducer-receiving holes 92, 122.

The particular optoelectric coupling or connector 10 also has pairs of direct contact terminals arranged in pairs that include terminals 130, 132 of a first pair and terminals 134, 136 of the second pair. As indicated in FIG. 2, the direct contact terminals such as 134,136 can be connected by forming one with a socket end 140 that receives a corresponding pin end 142 of the other terminal. Such additional terminals 130, 134 can be useful to establish ground potential or to transmit direct current electricity for energizing components such as the optoelectric transducers.

The optoelectric apparatus of FIG. 2 can be assembled by first mounting terminals such as 12 to a corresponding circuit board such as 40, inserting the transducers such as 16 in the separator 90, and inserting the transducer leads such as 64,66 into the corresponding circuit board holes. The terminals and leads are soldered in place to the corresponding circuit board traces. The assembly 150 shown in FIG. 3, is then inserted in a forward direction F into the shell 24, with the front insulator 30 and front seal 32 having been already installed. The spring contact 109 may be already installed or may be installed at the same time as the assembly 150. The rear seal 34 is then installed, and the rear insulator 36 (e.g. of epoxy) is installed (as by applying the epoxy in liquid form and letting it harden). If any of the signal paths do not function, the rear insulator 36 can be removed, and the components can be removed and repaired or replaced. It should be noted that an apparatus of the type illustrated, may include a large number of optoelectric paths and corresponding optoelectric arrangements, each with a pair of transducers and terminals, such as eight such arrangements. The construction facilitates mounting of a large number of the components in such connector. The use of prior art electrical connector technology which includes the use of a shell and various components of about the same width as the inside of a shell mounted in a stack therein, facilitates assembly and repair, and the provision of the components in a rugged and low cost assembly.

FIG. 4 illustrates another connector or optoelectric coupling apparatus 160 which is similar to that of FIGS. 1–3, except that it includes optoelectric transducers 162, 164 which are of the type that have surface mount terminal parts 170,172 (FIG. 5). Each transducer such as 162 is rigidly mounted to the inner face 174, 176 of a corresponding circuit board 180, 182 by soldering the surface mount terminal parts 170, 172 to corresponding traces 184, 186 on the board. Since the surface-mount terminal parts 170, 172 are not flexible, the transducer such as 162 is rigidly fixed in position and orientation on the circuit board. Nevertheless, a separator 190 (FIG. 4) is provided which has a hole 192 into which the transducers 162, 164 project so their light coupling ends 196 lie within the separator. The separator is opaque to prevent the leakage of light between one pair of transducers and another pair of transducers, in a connector that includes a plurality of pairs of transducers. The transducers are not closely received in the holes 192, and therefore lie in loose projection in the holes and are slideably received in the holes, although the holes assure that there is not gross misalignment of the transducers, since gross misalignment will prevent mounting of the elements of the connector in the shell 194. The fact that the transducers are not closely received in the holes 192, allows the transducers to be removed by removing the board from the separator. The shell 194 has a shorter rearward portion, but is otherwise of the same construction as the shell 24 of FIG. 2. The terminals 12A, 14A and insulators and seals 30A, 32A, 34A and 36A are similar to those of FIG. 2. The particular terminal 12A is shown as having barbs 198 that secure it within a plated hole of the circuit board 180.

Thus, the invention provides an optoelectric coupling apparatus or connector with one or a plurality of optoelectric paths along which signals are passed which include electrical signals that are converted into light and back into electric signals, which is of compact, rugged, and low cost construction. The connector is of a somewhat similar general construction to that of well developed electrical connectors, in that it includes a preferably metal shell and components mounted in the shell that extend across almost the entire width of the inside of the shell. Such components include circuit boards, a separator between the boards, and seals. An assembly includes a pair of circuit boards with electrical terminals extending from outer faces of the boards and with optoelectric transducers that may lie over the inner faces of the boards. The separator element can be provided to lie between the boards to separate them and prevent leakage of light between different transducers, and also to provide for alignment. Transducers with bodies and flexible leads can have their bodies closely positioned and oriented within holes of the separator elements, with their leads coupled to traces on the circuit board or even with a lead directly soldered to a corresponding terminal. Surface mounted transducers can be mounted directly on the board, with the separator having holes receiving parts of the transducers and assuring at least gross alignment while also avoiding light leakage and separating boards.

Although particular embodiments of the invention have been described and illustrated herein, it is recognized that modifications and variations may readily occur to those skilled in the art, and consequently, it is intended that the claims be interpreted to cover such modifications and equivalents.

The invention claimed is:

1. An optoelectric coupling apparatus which includes a connector shell that has an axis and that has an inside, first and second circuit boards mounted at axially spaced positions within said shell and having dielectric boards with inner board faces facing each other and outer board faces facing away from each other, and a plurality of pairs of transducers mounted on said circuit boards, with each pair including first and second transducers that are each mounted on a different one of said circuit boards, with each transducer of a pair having a transducer face facing toward a corresponding other transducer of the pair to transmit and receive light between them, including:

a one-piece integral opaque separator lying at a location within said shell between said circuit boards and occupying substantially the entire cross-sectional area of said shell at said location, said separator having a plurality of through holes that each loosely receives at least part of each transducer of a pair.

2. The apparatus described in claim 1 wherein:

said separator has a thickness substantially equal to the distance between the inner faces of said circuit boards and substantially abuts said inner faces of said circuit boards.

3. The apparatus described in claim 1 wherein:

said first and second transducers each has a plurality of flexible leads fixed to a corresponding one of said circuit boards and has a body that is spaced from a corresponding circuit board inner face and that is held in substantially a predetermined orientation in said separator to assure that the two transducers of a pair are aligned.

4. The apparatus described in claim 1 wherein:

said transducer faces of each pair of transducers lie substantially against one another.

5. A connector comprising:

a shell which has an axis;

first and second circuit boards lying in said shell, said boards having inner faces that face each other and outer faces that face away from each other, all in directions that are substantially parallel to said axis, and each board having a plurality of conductive traces;

a plurality of pairs of optoelectric transducers, each transducer having a body and leads and being mounted on one of said boards with its leads electrically connected to a plurality of said traces and at least part of its body lying over the inner side of a corresponding circuit board and facing the body of the other transducer of the pair;

an opaque separator that lies between said boards and that has a plurality of through holes with hole walls that optically isolate said pairs of transducers from each other, with each hole being aligned with the bodies of one of said pairs of transducers and with a plurality of said transducers lying loosely in said holes.

6. The connector described in claim 5 wherein:

the body of each transducer lies closely enough in one of said separator holes that the body is positioned and oriented by the walls of the hole.

7. A method for optocoupling each of a plurality of pairs of transducers which includes mounting each transducer of a pair on a different one of a pair of circuit boards, wherein said circuit boards have inner board faces that face each other, with each transducer being positioned over the inner face of the circuit board on which the transducer is mounted, with at least one transducer of each pair having a light emitting part that is oriented to emit light away from the corresponding circuit board on which the transducer is mounted, and with at least the other transducer of each pair having a light detecting part that is oriented to receive light moving toward the corresponding board, and mounting said boards in a shell with the inner faces of said boards facing each other and with pairs of said transducer aligned so light emitted from one transducer of a pair is received by the other transducer of the pair, characterized by:

forming an opaque separator which has opposite faces and a plurality of through holes, placing said opaque separator between said circuit boards, moving a first of said circuit boards toward one of said opaque separator faces, and inserting a plurality of said transducers into said holes in said one opaque separator face.

8. The method described in claim 7 wherein:

each of said boards has a plurality of traces and each of said transducers has a body and a plurality of elongated bendable leads extending from said body and mounted to a corresponding one of said circuit boards with one of said leads connected to a corresponding one of said traces, and said step of inserting said transducers includes inserting the body of each transducer within a hole in said opaque separator until the corresponding circuit board substantially abuts said opaque separator, and with said separator holes having hole walls that closely surround said bodies to assure their proper positions and orientations to align each with the other transducer of the pair, and including bending at least some of said leads to enable all of said bodies to enter said holes.

9. The method described in claim 7 wherein:

said step of forming an opaque separator includes forming it with said opposite faces being substantially parallel, and including placing said -6 opaque separator faces adjacent to the inner faces of said boards.

* * * * *